(12) United States Patent
Limb

(10) Patent No.: US 7,998,868 B2
(45) Date of Patent: Aug. 16, 2011

(54) SELF-ALIGNED MASKS USING MULTI-TEMPERATURE PHASE-CHANGE MATERIALS

(75) Inventor: Scott Jong Ho Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/713,704

(22) Filed: Feb. 26, 2010

(65) Prior Publication Data

US 2010/0184300 A1   Jul. 22, 2010

Related U.S. Application Data

(63) Continuation of application No. 11/539,974, filed on Oct. 10, 2006, now Pat. No. 7,696,096.

(51) Int. Cl.
*H01L 21/311* (2006.01)

(52) U.S. Cl. ........ 438/698; 438/699; 438/673; 438/759; 438/760; 257/E21.023

(58) Field of Classification Search .................. 438/313, 438/318, 330, 669, 673, 698, 759, 760; 257/E21.023
See application file for complete search history.

(56) References Cited

U.S. PATENT DOCUMENTS

| | | |
|---|---|---|
| 5,695,658 A | 12/1997 | Alwan |
| 6,365,325 B1 | 4/2002 | Chiang et al. |
| 6,534,225 B2 | 3/2003 | Flanders et al. |
| 6,742,884 B2 | 6/2004 | Wong et al. |
| 6,872,320 B2 | 3/2005 | Wong et al. |
| 7,033,951 B2 | 4/2006 | Kido |
| 7,344,928 B2 | 3/2008 | Wong et al. |
| 2003/0027082 A1 | 2/2003 | Wong et al. |
| 2004/0110094 A1 | 6/2004 | Chen et al. |

*Primary Examiner* — George Fourson
*Assistant Examiner* — John M Parker
(74) *Attorney, Agent, or Firm* — Marger Johnson & McCollom, P.C.

(57) ABSTRACT

A method of forming a pattern includes forming a first layer on a substrate, forming a second layer on the first layer, depositing a multi-temperature phase-change material on the second layer, patterning the second layer using the multi-temperature phase-change material as a mask, reflowing the multi-temperature phase-change material, and patterning the first layer using the reflowed multi-temperature phase-change material as a mask.

16 Claims, 9 Drawing Sheets

SELF-ALIGNED MASKS USING MULTI-TEMPERATURE PHASE-CHANGE MATERIALS

CROSS REFERENCE TO RELATED APPLICATIONS

This application is a continuation of U.S. patent application Ser. No. 11/539,974, filed on Oct. 10, 2006, now pending, the disclosure of which is herein incorporated by reference.

BACKGROUND

This disclosure relates to the formation of patterns for semiconductor devices, in particular, to the formation of patterns for thin film transistors (TFT).

Current TFT processes use 5 masks. Such masks may be use to form patterns through photolithography. During photolithography, a photosensitive material is deposited on a layer to be patterned. A mask is used to expose the photosensitive material. The exposed photosensitive material is removed during a developing process. The remaining photosensitive material is used as an etch mask to pattern the layer to be patterned. After patterning, the remaining photosensitive material is removed. Such processes are performed for each mask used in forming the TFT.

In forming a TFT, both a semiconductor layer for the channel of the TFT and a conductive layer for the source and drain contacts are patterned. Typically, separate masks are used for each layer. Thus, as described above, two photolithography process are used to form the etch masks.

As the number of masks and corresponding photolithography steps increase, manufacturing time and costs similarly increase. Thus, there remains a need for an improved technique for forming patterns.

SUMMARY

An embodiment includes forming a pattern including forming a first layer on a substrate, forming a second layer on the first layer, depositing a multi-temperature phase-change material on the second layer, patterning the second layer using the multi-temperature phase-change material as a mask, reflowing the multi-temperature phase-change material, and patterning the first layer using the reflowed multi-temperature phase-change material as a mask.

Another embodiment includes forming a pattern including providing a layer, forming a multi-temperature phase-change material pattern of a multi-temperature phase-change material on the layer such that at least a portion of a desired pattern is not covered by the multi-temperature phase-change material pattern, reflowing the multi-temperature phase-change material pattern such that the reflowed multi-temperature phase-change material pattern substantially covers the desired pattern, and etching the layer using the reflowed multi-temperature phase-change material pattern as a mask.

Another embodiment includes a semiconductor device including a gate pattern, an island pattern disposed over the gate pattern, and a source/drain pattern disposed over the island pattern, crossing the gate pattern, and including a gap separating a source pattern from a drain pattern. The island pattern extends a substantially uniform distance from a portion of the source/drain pattern. A distance between the source pattern and the drain pattern across the gap is greater than about 10 μm.

DETAILED DESCRIPTION

Figure 1:
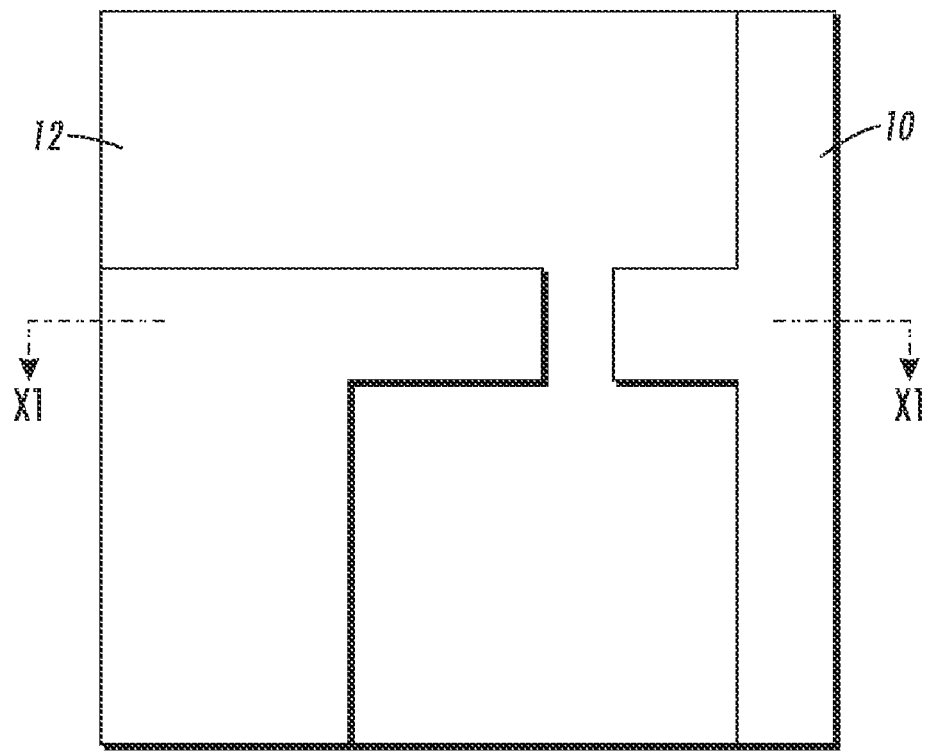
FIGS. 1, 3, 5, and 7 are plan views illustrating forming a pattern according to an embodiment.

Materials may be generally described as solids, liquids, gasses, or combinations of such states. When an amount of energy is added or removed from a material, the material may undergo a phase change. A phase change is a transition from a first state, such as a solid state, to a second state, such as a liquid state. In general, a material will change phase at about a single temperature. For example, water changes phase into ice at about 0° C.

As used in this description, a multi-temperature phase-change material is a material that as a whole substantially changes phase over a temperature range. Such a temperature range may be relatively large as compared with the temperature range for a phase change of other materials that change phase at about a single temperature.

For example, a multi-temperature phase-change material may be a mixture of a first wax and a second wax, each undergoing a phase change at different temperature ranges. The first wax may change from a solid to a liquid at about 73° C. The second wax may change from a solid to a liquid at about 100° C. Thus, below, about 73° C. the mixture may be substantially solid. Between 73° C. and 100° C., a first portion of the mixture corresponding to the first wax may be a liquid and a second portion corresponding to the second wax may remain a solid. Above 100° C., the entire mixture may be a liquid. Thus, the mixture may be a multi-temperature phase-change material since the phase change for the material as whole occurs over a temperature range.

Although as described above, a multi-temperature phase-change material may change phase at two discrete temperatures, a multi-temperature phase-change material may also change phase over a substantially continuous temperature range. For example, a mixture of multiple waxes, each having an increasing melting point, would transition from substantially solid to substantially liquid over a relatively large range as compared with the temperature for an individual wax of the mixture. Although each component wax may undergo a discrete phase change at an associated temperature, the mixture as a whole would exhibit a phase change across the temperature range defined by the component waxes.

Although a phase change has been described as occurring at a particular temperature, that particular temperature may appear to correspond to a temperature range. Temperature of a substance is a measurement of a mean of the kinetic energy of molecules of the substance. Using water as an example, although water is generally described as transitioning from a solid to a liquid at 0° C., both superheated ice and supercooled water may exist. Superheated ice is ice with a temperature higher than 0° C. Similarly, supercooled water is water with a temperature lower than 0° C. However, superheated and supercooled states merely shift the phase change temperature. Even a material that is understood to change phase at a commonly known temperature may still change phase at a different temperature range, but only as a result of environmental conditions. Thus, the material does not change phase over a temperature range, but at a particular temperature based on environmental conditions.

A multi-temperature phase-change material is distinguished from the material described above. The multi-temperature phase-change material exhibits a substantially stable percentage of the material that has changed state. For example, using the wax mixture described above, at a temperature between 73° C. and 100° C., such as 80° C. a percentage of the wax mixture may have changed phase to a liquid. However, the remainder will not change phase until the mixture is heated to 100° C. Thus, a temperature between 73° C. and 100° C. the solid to liquid percentage of the mixture is substantially stable.

Furthermore, there exists a class of materials commonly known as Phase Change Materials. Phase Change Materials typically refer to materials characterized by relatively high heats of fusion. However, as used in this description, a multi-temperature phase-change material is not limited to including only such materials. In fact, a particular multi-temperature phase-change material may include materials with relatively low heats of fusion.

In addition, portions of multi-temperature phase-change materials may have a low viscosity in liquid form. As used in this discussion, a low viscosity is a viscosity that is within a few orders of magnitude of the viscosity of water. Thus, when a multi-temperature phase-change materials is heated such that a portion changed phase, the low viscosity liquid may quickly flow to a stable state limited by surface tension. In contrast, if the viscosity of the liquid was relatively high, then the shape of the heated material is more dependent on the time left at the temperature.

One embodiment includes forming a pattern. A first layer is formed on a substrate. A second layer is formed over the first layer. A multi-temperature phase-change material is deposited on the second layer. The second layer is patterned using the multi-temperature phase-change material as a mask. The multi-temperature phase-change material is reflowed. The first layer is patterned using the reflowed multi-temperature phase-change material as a mask.

FIGS. 1, 3, 5, and 7 are plan views illustrating forming a pattern according to an embodiment. FIGS. 2, 4, and 6 are cross sectional views corresponding to FIGS. 1, 3, and 5, respectively. The embodiment illustrated in FIGS. 1-7 is that of processes included in the formation of a TFT. However, as described below, the processes may be applied to the formation of structures other than a TFT.

Figure 2:
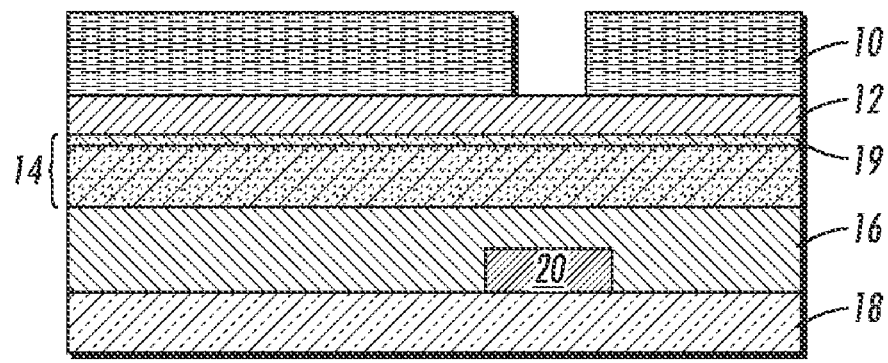
FIGS. 2, 4, and 6 are cross sectional views corresponding to FIGS. 1, 3, and 5, respectively.

Referring to FIGS. 1 and 2, the cross section of FIG. 2 corresponds to plane X1 of FIG. 1. In this embodiment, a gate pattern 20 is formed on the substrate 18. A dielectric layer 16 is formed on the substrate 18, over the gate pattern 20.

The combination of the substrate 18, the gate pattern 20, and the dielectric layer 16 may collectively be the substrate described above on which the first layer is formed. However, the substrate described above need not be any particular combination of layers. The substrate only needs to be a layer upon which the first layer may be formed.

A semiconductor layer 14 is formed on the dielectric layer 16. The semiconductor layer 14 may be an amorphous silicon layer, crystalline silicon layer, or other semiconductor layer. In addition, the semiconductor layer 14 may include a doped semiconductor layer 19 for forming electrical contacts. In this embodiment, the semiconductor layer 14 corresponds to the first layer described above. However, the first layer is not limited to a semiconductor. The first layer may be any material to be patterned as desired.

The source/drain layer 12 is formed on the semiconductor layer 14. The source/drain layer 12 may be any variety of conductive material. For example, the source/drain layer 12 may be a metal layer. In one embodiment, the doped semiconductor layer 19 of the semiconductor layer 14 forms contacts with the metal layer. Since the source/drain layer 12 is formed on the semiconductor layer 14, the source/drain layer 12 would be the second layer described above.

A multi-phase change temperature material 10 is deposited on the source/drain layer 12. The multi-phase change temperature material 10 may be deposited in a variety of ways. For example, the multi-phase change temperature material 10 may be deposited by digital printing.

During the digital printing process, the multi-temperature phase-change material may include printing the multi-temperature phase-change material in a substantially liquid state. Thus the temperature of the multi-temperature phase-change material may be higher than the temperature range over which the multi-temperature phase-change material substantially changes from a solid to a liquid. When it is deposited, the conditions may cause the temperature of the multi-temperature phase-change material to substantially phase change into a solid. Thus, the multi-temperature phase-change material is at a temperature suitable for subsequent patterning and reflowing from an initial solid state.

Although printing has been described as a process for depositing the multi-temperature phase-change material 10, other processes may be used. For example, the multi-temperature phase-change material 10 may also be deposited by extrusion, screen printing, etc. Any technique suitable for depositing the multi-temperature phase-change material may be used.

Figure 3:
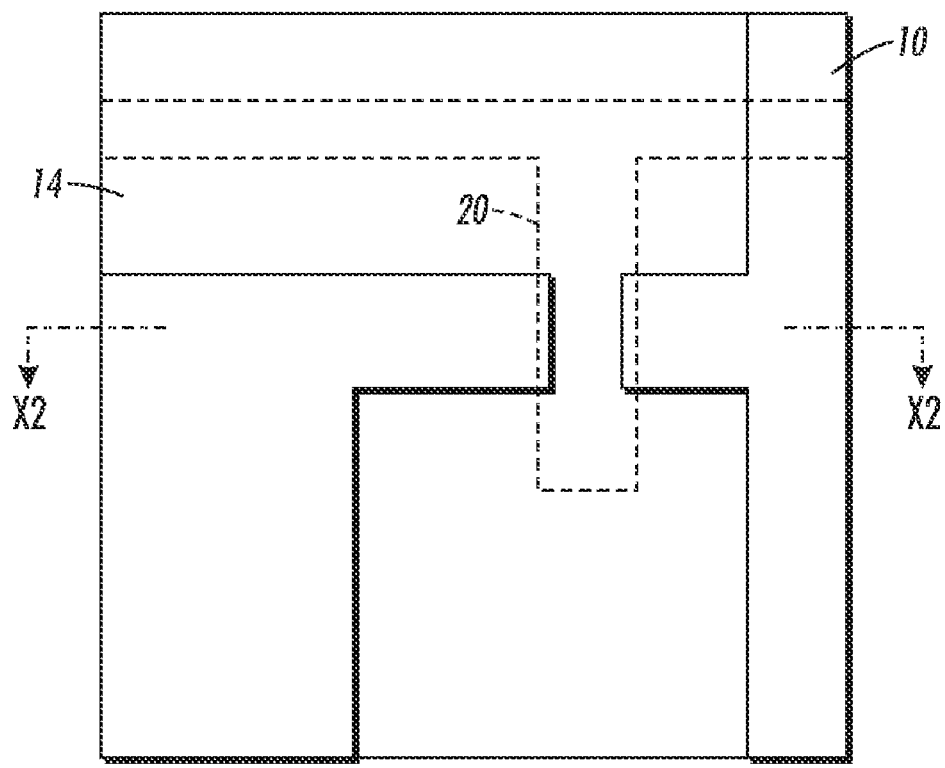
Figure 4:
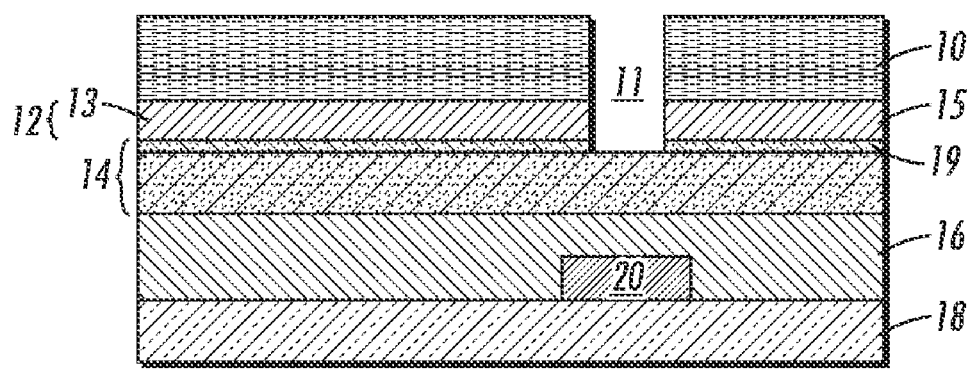

Referring to FIGS. 3 and 4, FIG. 4 is a cross section along the plane X2 of FIG. 3. The second layer is patterned using the multi-temperature phase-change material as a mask. Thus, in this example, the source/drain layer 12, forming the second layer, is patterned using the multi-temperature phase-change material 10 as a mask. As can be seen in FIG. 3, areas not covered by multi-temperature phase-change material 10 were removed, revealing the semiconductor layer 14. In this embodiment, the doped semiconductor layer 19 is removed as well using the multi-temperature phase-change material 10 as a mask. However, the doped semiconductor layer 19 may be removed through other processes with or without using the multi-temperature phase-change material 10 as a mask.

As can be seen in FIG. 4, a gap 11 has been formed in the source/drain layer 12 isolating the source and drain contacts for this particular TFT. Thus, the etching of the source/drain layer 12 results in the gap 11 separating the source contact 13 from the drain contact 15.

Figure 5:
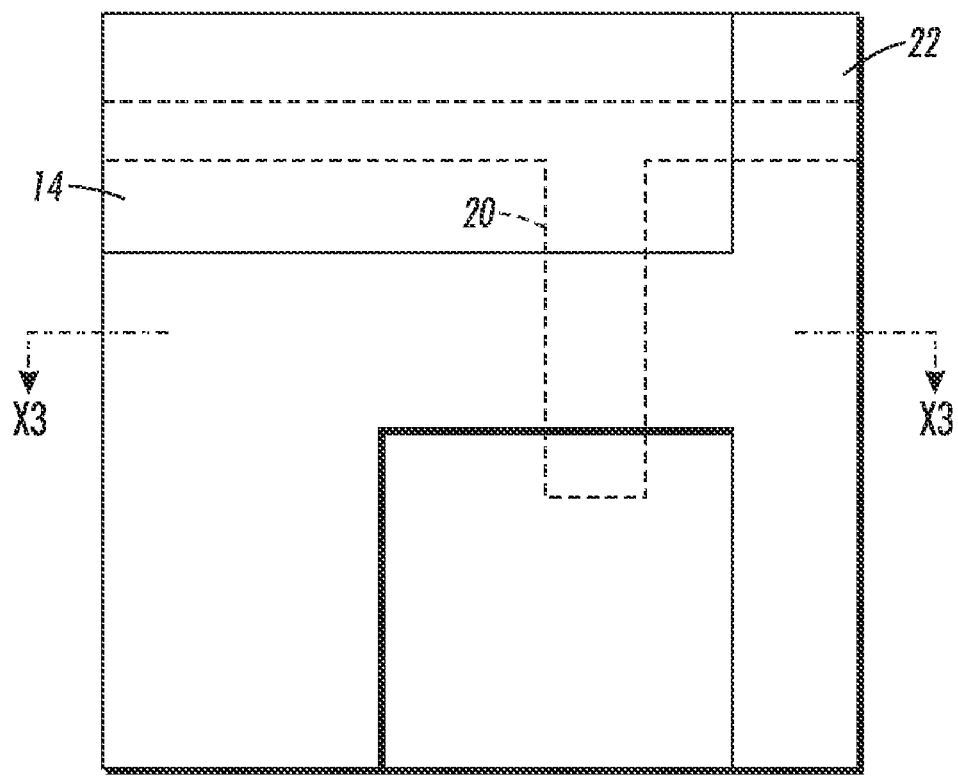
Figure 6:
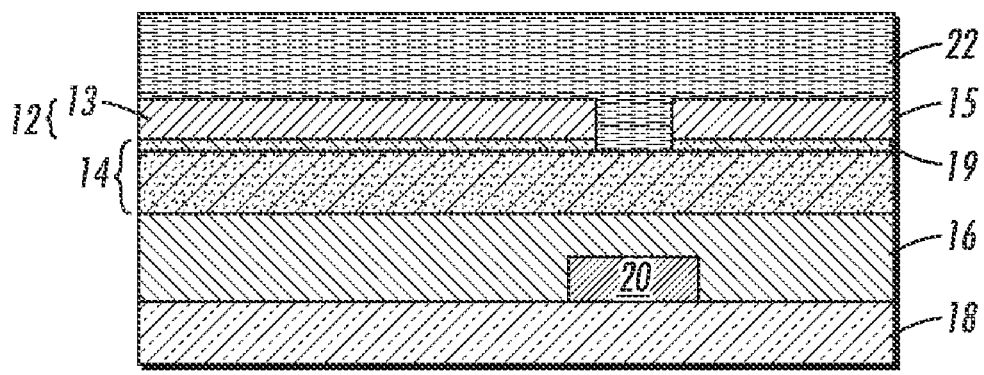

Referring to FIGS. 5 and 6, FIG. 6 is a cross section along the plane X3 of FIG. 5. The multi-temperature phase-change material 10 is then reflowed. As described above, when brought to a particular temperature, a percentage of the multi-temperature phase-change material 10 will change state to a liquid. In this example, the multi-temperature phase-change material is reflowed such that if forms the reflowed multi-temperature phase-change material 22.

In one example, the multi-temperature phase-change material 10 is reflowed at a temperature where only a portion of the entire multi-temperature phase-change material 10 becomes a liquid. Consequently, a portion remains a solid. The liquid portion can flow away from the solid portion forming the reflowed multi-temperature phase-change material 22.

In another example, the temperature at which the multi-temperature phase-change material 10 is reflowed may be between two temperatures at which two respective portions undergo respective phase changes. As described above, the multi-temperature phase-change material 10 may be a mixture of first and second waxes that undergo respective phase changes at about 73° C. and 100° C. Thus, the multi-temperature phase-change material 10 may be reflowed at a temperature between 73° C. and 100° C. As a result, the first wax would change phase into a liquid while the second wax remains solid.

The wax used as an example above is also an example of a form of a multi-temperature phase-change material. A multi-temperature phase-change material may be a mixture of multiple materials, each undergoing a phase change at a different temperature. Alternatively, the multi-temperature phase-change material may be a homogenous material that exhibits the phase change characteristics described above.

By reflowing the multi-temperature phase-change material at a temperature below which the entire material changes phase into a solid, structure of the original multi-temperature phase-change material 10 is maintained by the remaining solid portion. However, the portion that changed phase in to a liquid could flow away from the original pattern. Thus, the reflowed multi-temperature phase-change material 22 includes both the shape of the original multi-temperature phase-change material 10, and an expanded version.

The amount of expansion may be controlled by a variety of factors. For example, the relative percentages of materials forming the multi-temperature phase-change material 10 may affect the amount of expansion. The multi-temperature phase-change material 10 may include about 10% of a low melting point material and about 90% of a high melting point material. Thus, when heated to a temperature between the high and low melting points, only about 10% of the multi-temperature phase-change material 10 would become a liquid. Because of surface tension, the liquid portion will only extend a particular distance from the remaining solid portion.

In another example, the multi-temperature phase-change material 10 may include about 50% of a low melting point material and about 50% of a high melting point material. In contrast to the example described above, about 50% of the multi-temperature phase-change material will become a liquid when heated to the temperature between the high and low melting points. Surface tension will still retain the liquid portion in the vicinity of the solid portion. However, since there is more liquid material than the previous example, the distance the liquid material may flow from the solid material may be increased. Thus, if the multi-temperature phase-change material 10 is each case were formed with the same initial shape, the resulting expansion into the reflowed multi-temperature phase-change material 22 will be increased in the 50%/50% mixture as compared with the 10%/90% mixture.

In addition, time may be used to control the amount of expansion. An amount of energy is typically required to change the phase of a substance. This energy is referred to as a the heat of fusion for a change between a liquid to a solid state. As a result, with a known energy input rate and a material with a known energy required to change the phase, the portion of the material that would change phase at that temperature can be controlled by controlling the rate of energy applied and the time the energy is applied. Thus, the percentage of the multi-temperature phase-change material that changes phase can be controlled by controlling the energy input.

Although time has been described as being used to control the amount of expansion, a sufficient time may be needed to allow the liquid portion to reach a stable state. Reflowing may be for a short period. For example, for a particular wax mixture, the time for the liquid portion to stabilize may be less than about 10 seconds.

Regardless of the way that the expansion during the reflowing of the multi-temperature phase-change material is controlled, the expansion may be controlled such that a portion of the multi-temperature phase-change material extends substantially a predefined distance from a remainder of the multi-temperature phase-change material. Thus, the shape of the pattern etched with the reflowed multi-temperature phase-change material as a mask can be controlled For example, a particular gap between a source contact and a drain contact of a TFT may be needed. So that the semiconductor layer 14 that forms the channel is not etched, the multi-temperature phase-change material used to etch both the source/drain layer 12 and the semiconductor layer 14 must extend far enough to bridge the gap 11. The multi-temperature phase-change material may be heated in such a way that the liquid portion extends a sufficient amount to bridge the gap.

After reflowing the semiconductor layer 14 is then patterned using the reflowed multi-temperature phase-change material 22 as a mask. In one example, the reflowed multi-temperature phase-change material 22 is cooled until the entire multi-temperature phase-change material 22 returns to a solid.

Figure 7:
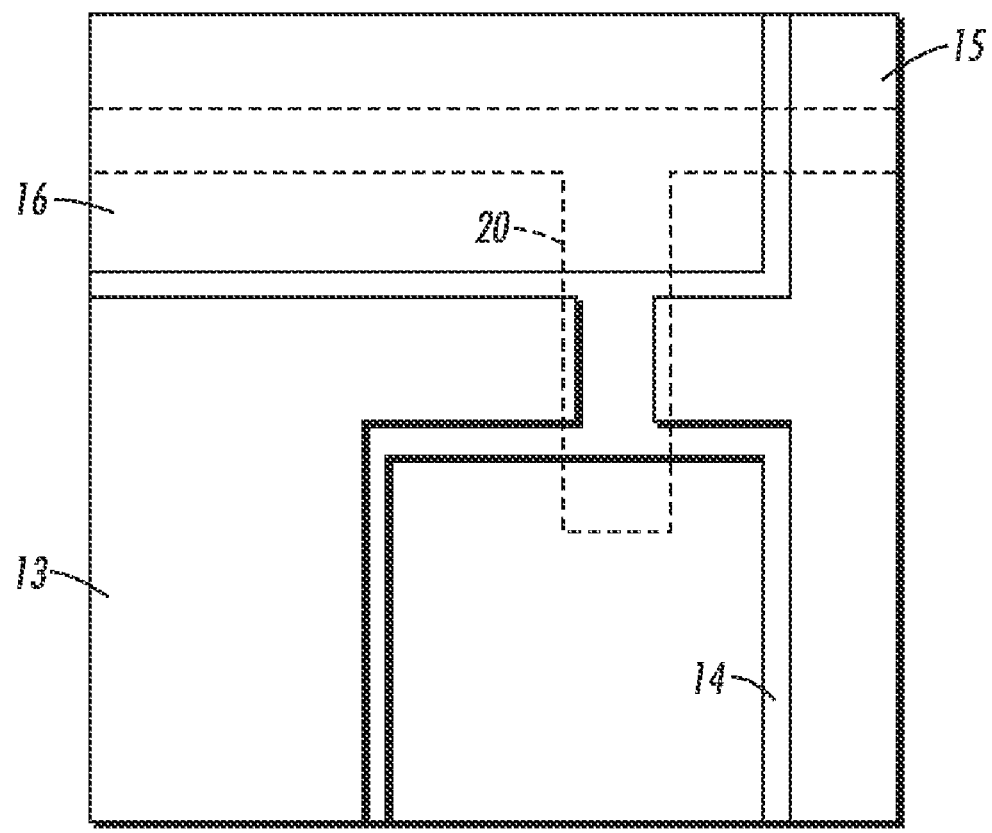

FIG. 7 illustrates the state of the substrate after patterning. As described above, the mask for the source/drain layer 12 was the multi-temperature phase-change material 10. Thus, the patterned source/drain layer 12 had substantially the same shape as the multi-temperature phase-change material 10. Similarly, since the reflowed multi-temperature phase-change material 22 was used as a mask for the semiconductor layer 14, the patterned semiconductor layer 14 has substantially the same shape as the reflowed multi-temperature phase-change material 22. As a result, the shape of the patterned semiconductor layer 14 is that of the source/drain layer 12 expanded as the reflowed multi-temperature phase-change material 22.

As described above, the mask for the semiconductor layer 14 was obtained from the mask used for source/drain layer 12. Thus, an additional mask formation procedure and its associated costs are not needed.

Furthermore, since the source/drain layer 12 and the semiconductor layer 14 were patterned from masks having a common source(the multi-temperature phase-change material 10), the source/drain layer 12 and the semiconductor layer 14 are self-aligned. Thus, any misalignment due to separately formed masks is eliminated. In particular, applications for TFTs may include plastic or other flexible substrates. Thus, there is an increased potential for movement of layers. As a result of reflowing the multi-temperature phase-change material to generate the masks, an additional mask is not needed. Thus, the misalignment of those masks no longer affects the process.

In another embodiment, the selection of the components or phase change characteristics of a multi-temperature phase-change material can be made with respect to an apparatus used to perform the reflowing. For example, consider a heating apparatus can maintain a temperature within a three degree range. When using the apparatus to reflow a multi-temperature phase change material. The multi-temperature phase-change material may be selected that has a first and a second phase change separated by more than three degrees, the tolerance of the apparatus. Thus, when the multi-temperature phase change material is heated to a temperature in between the phase change temperatures of the material, the variation of the heating apparatus does not cause the temperature to stray outside of the temperatures associated with the first and second phase changes. As a result, substantially all of one portion will change phase and substantially all of the other portion will not change phase.

In addition, such selection in accordance with attributes of the multi-temperature phase change material is not limited to a multi-temperature phase change material having discrete phase changes. As described above, a multi-temperature phase change material may have a continuous phase change characteristic where an increasing percentage of the material changes phase as temperature increases. Such a multi-temperature phase change material may be selected so that the variability of the percentage of the material that changes phase as a result of the variability of the apparatus does not substantially impact the desired expansion of the multi-temperature phase change material. For example, the multi-temperature phase change material may have a phase change characteristic that spans 30 degrees. Thus the apparatus has a small temperature variation relative to the phase change temperature range of the multi-temperature phase change material. As a result, even if the temperature varies, the change in the percentage of material that changes phase may not be significant.

The process of reflowing and patterning using the multi-temperature phase-change material may be repeatedly performed. For example, if a multi-temperature phase-change material has three discrete temperature ranges where portions change phase, three separate patterning operations may be performed. One patterning operation may be performed with the entire material solid. A second patterning operation may be performed after reflowing at a temperature between the lower to temperature ranges. A third patterning operation may be performed after reflowing at a temperature between the upper two temperature ranges. Thus, more than two patterning operations may be performed by repeatedly reflowing the material.

Although a patterning operation has been described above as occurring after reflowing only a portion of the multi-temperature phase-change material, the entire multi-temperature phase-change material may be reflowed to create another mask. Thus, any reflowed state of the multi-temperature phase-change material may be used as a mask.

Figure 8:
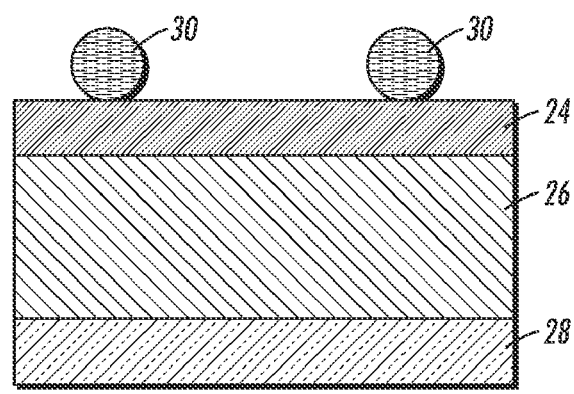
FIGS. 8-12 are cross sectional views illustrating forming a pattern according to another embodiment.

FIGS. 8-12 are cross sectional views illustrating forming a pattern according to another embodiment. Referring to FIG. 8, a first layer 26 is formed on the substrate 28. A second layer 24 is formed on the first layer 26. A multi-temperature phase-change material pattern 30 is deposited.

Figure 9:
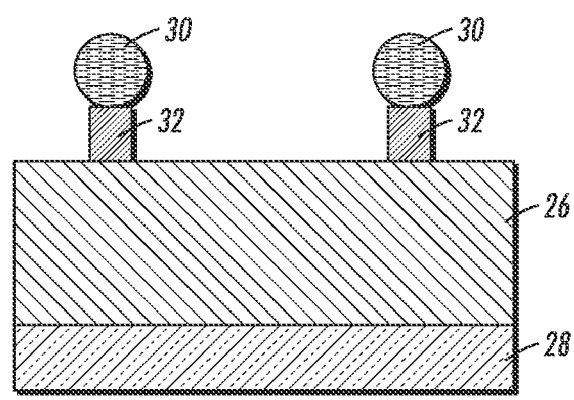
Figure 10:
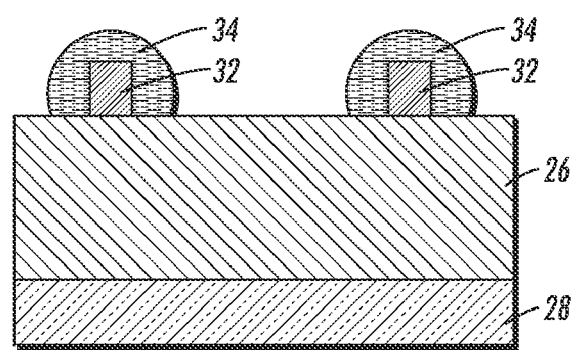

Referring to FIG. 9, using the multi-temperature phase-change material pattern 30 as a mask, the first layer 26 is patterned into a first patterned layer 32. The multi-temperature phase-change material pattern 30 is reflowed into the reflowed multi-temperature phase-change material pattern 34 as illustrated in FIG. 10.

Figure 11:
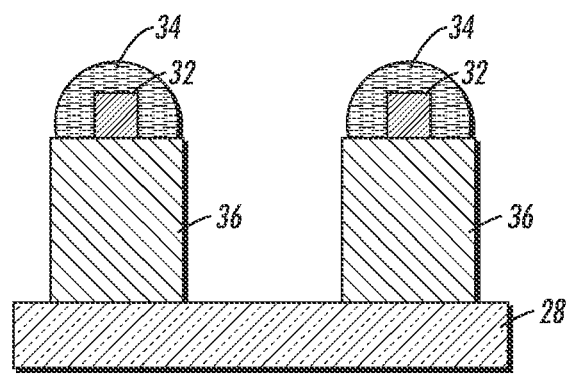
Figure 12:
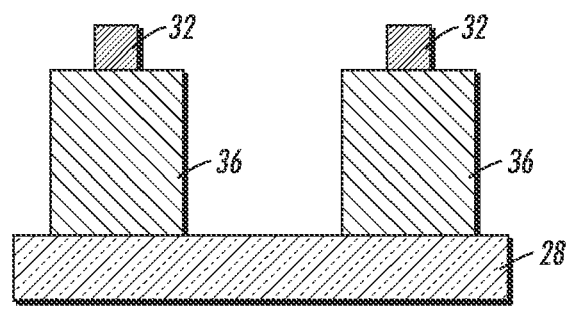

As illustrated in FIG. 11, the first layer 26 is etched using the reflowed multi-temperature phase-change material pattern 34 as mask. As a result, the first layer 26 is etched into pedestals 36. Previously, such structure would have needed an additional mask forming process. However, by expanding the multi-temperature phase-change material pattern 30 into the reflowed multi-temperature phase-change material pattern 34, only one mask formation process is needed.

FIGS. 13-17 are cross sectional views illustrating forming a pattern according to another embodiment. In this embodiment a multi-level terrace structure is formed using a multi-temperature phase-change material.

Figure 13:
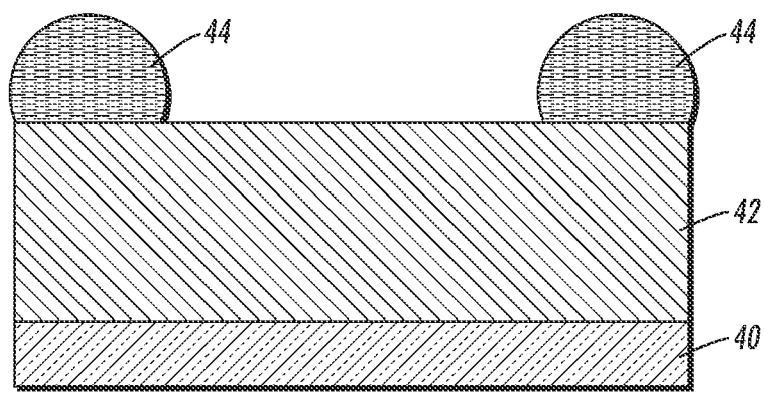
FIGS. 13-17 are cross sectional views illustrating forming a pattern according to another embodiment.
Figure 14:
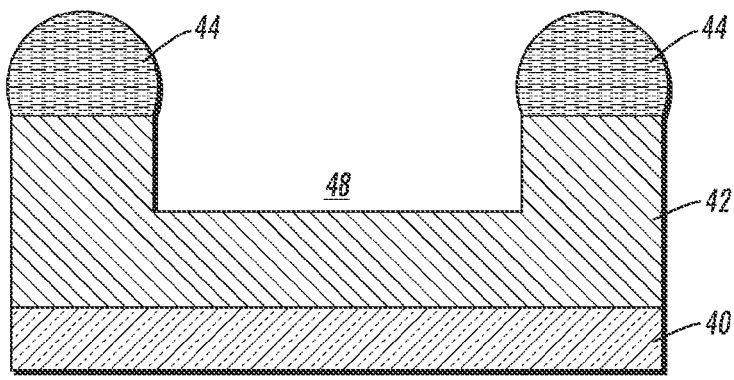

FIG. 13 illustrates a multi-temperature phase change material 44 formed on a layer 42. The layer 42 is formed on a substrate 40. FIG. 14 illustrates the structure of FIG. 13 after patterning. Thus trench 48 is formed in the layer 42.

Figure 15:
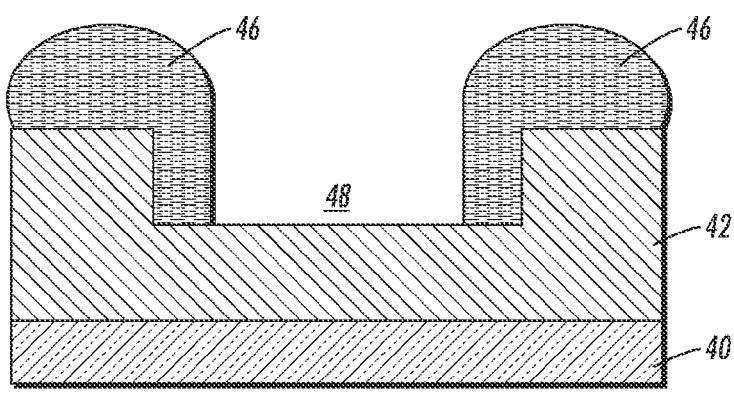

FIG. 15 illustrates the reflowed multi-temperature phase-change material 46. When reflowed, the reflowed multi-temperature phase-change material 46 flows into the trench 48. However, in this example, the outer edges of the reflowed material do not intersect and combine.

Figure 16:
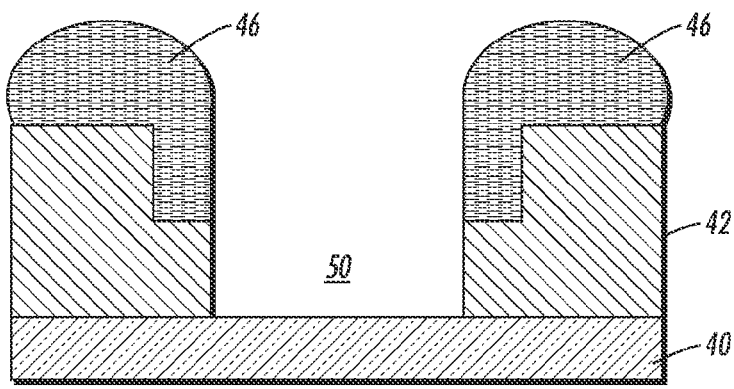
Figure 17:
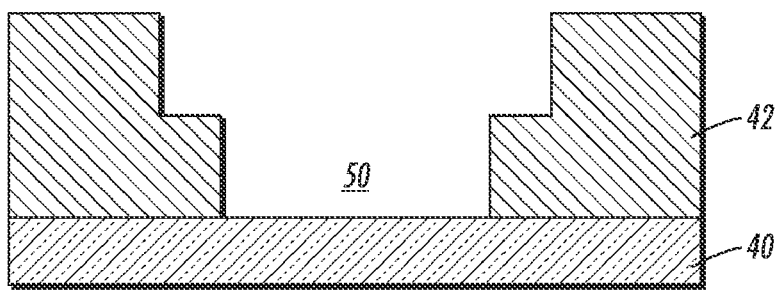

In FIG. 16, a trench 50 is formed when the reflowed multi-temperature phase-change material 46 is used as a mask. Thus, as illustrated in FIG. 17, a terraced structure may be formed.

Although the layer 42 is illustrated as a single homogenous layer, the layer 42 may be formed of multiple homogenous or heterogeneous layers. For example, if forming the trench 48 of FIG. 14, the bottom of the trench 48 may be formed by a second layer different from the first layer 42.

In one embodiment the structure illustrated in FIGS. 13-17 may be a via structure. Vias may be formed with the terraced structure to reduce the effective angle of the sidewall. As little as two etchings may result in an intermediate step within the via. The substrate 40 may be a conductive contact for a different layer.

Figure 18:
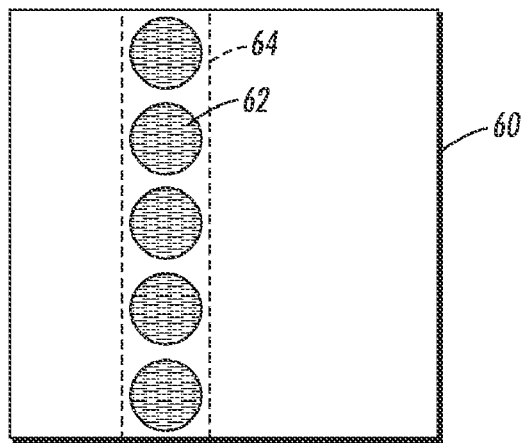
FIG. 18 is a plan view illustrating forming a pattern according to another embodiment.

FIG. 18 illustrates a plan view of forming a pattern according to another embodiment. A layer 60 is provided. On the layer 60, a multi-temperature phase-change material 60 is deposited. There is a desired pattern 64. The desired pattern 64 illustrates the desired pattern in layer 60. A multi-temperature phase-change material pattern 62 made of a multi-temperature phase-change material is deposited on the layer 60. It is deposited such that a portion of the desired pattern 64 is exposed. Thus, if the layer 60 was patterned using the multi-temperature phase-change material pattern 62 as a mask, the resulting pattern in the layer 60 would not be the desired pattern 64.

Figure 19:
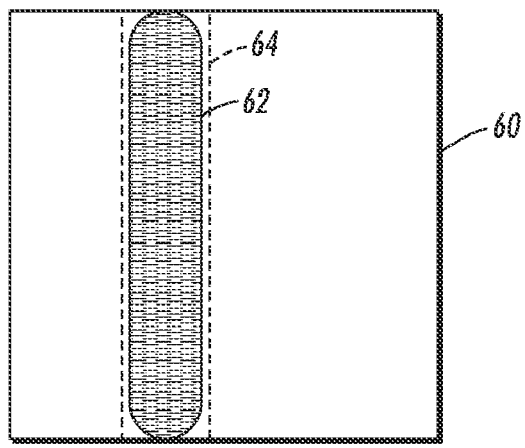
FIG. 19 is a plan view illustrating the plan view of FIG. 18 after reflowing.

The multi-temperature phase-change material pattern 62 is reflowed into the reflowed pattern 66. FIG. 19 illustrates the relationship of the reflowed pattern 66 to the desired pattern 64. In one example, the multi-temperature phase-change material pattern 62 is reflowed such that the reflowed multi-temperature phase-change material pattern 66 substantially covers the desired pattern 64. As a result, a reduced amount of material was used to form a mask that substantially covers the desired pattern 64. The layer 60 may then be etched with a reflowed multi-temperature phase-change material pattern 66 as a mask to form the desired pattern 64.

Although the incomplete coverage of a desired pattern may be intentional, such an incomplete coverage may be a result of a processing error or other unintentional occurrence. For example, a multi-temperature phase-change material 62 may be deposited, yet a pinhole, discontinuity, printing defect, or other processing defect may expose a portion of the desired pattern 64. If the layer 60 was patterned with the defect, the resulting device may operate incorrectly, have a reduced reliability, or experience some other detrimental effect. However, the multi-temperature phase-change material 62 may be reflowed such that the liquid portion covers the defect. Thus, when the layer 60 is patterned, the defect in the original multi-temperature phase-change material 62 does not affect the device.

Thus, embodiments where a multi-temperature phase-change material is deposited and both etched before reflowing and reflowed before etching have been described. Depending on the multi-temperature phase-change material, there may be multiple temperatures at which multiple percentages of the multi-temperature phase-change material changes phase into a liquid. For example, during a first reflow process, 10% of the multi-temperature phase-change material is reflowed. The first reflow process may correct for defects as described above. Then a first patterning may occur. A second reflow process may reflow 50% of the multi-temperature phase-change material to create an expanded multi-temperature phase-change material pattern as described above. Further patterning and reflowing may be performed as desired. Any combination of patterning and reflowing may be used as desired.

Figure 20:
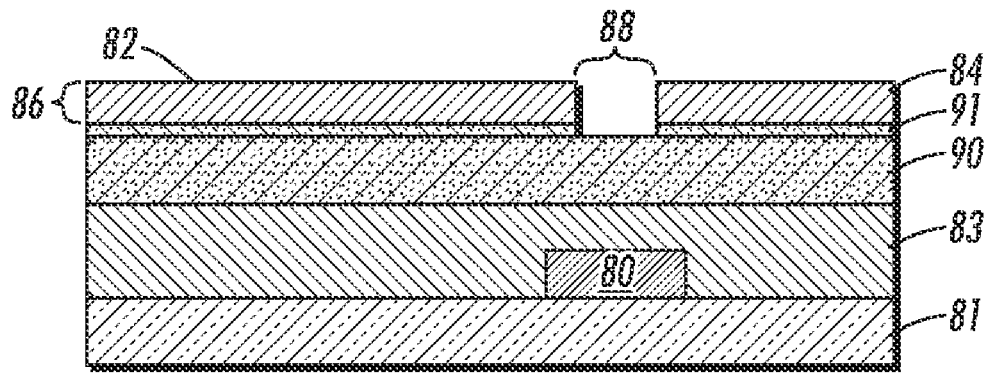
FIGS. 20 and 21 are a cross section and plan view of a semiconductor device according to an embodiment.
Figure 21:
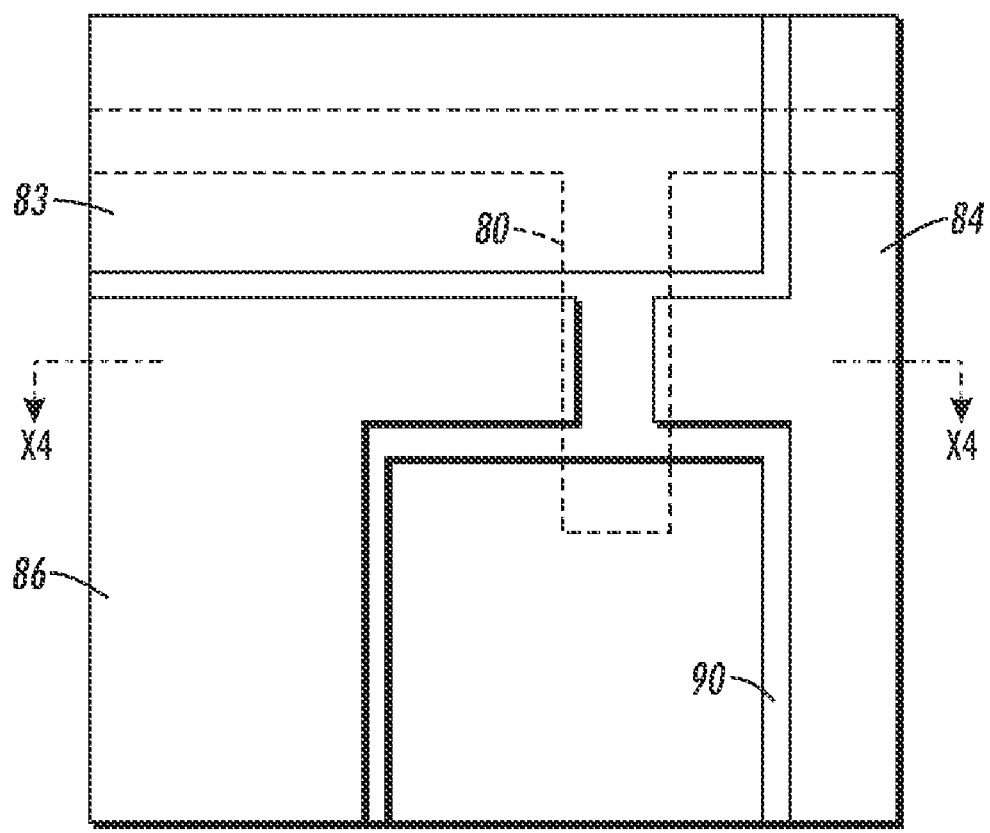

FIGS. 20 and 21 illustrate a cross section and a plan view of a semiconductor device according to an embodiment. FIG. 20 is a cross section along the plane X4 of FIG. 21. The semiconductor device includes a substrate 81, gate pattern 80, a dielectric 83, an island pattern 90, and a source/drain pattern 86. Similar to the substrates described above, the substrate 81 may be any variety of substrates formed of one or multiple layers.

The gate pattern 80 is disposed over the substrate 81. The dielectric layer 83 is disposed over the substrate 81 and the gate pattern 80. The island pattern 90 is disposed over the dielectric layer 83. In this embodiment, the island pattern 90 includes a doped semiconductor layer 91. Although the doped semiconductor layer 91 has substantially the same shape of the source/drain pattern 86, in other embodiments the doped semiconductor layer 91 may have other shapes.

The source/drain pattern 86 is disposed on the island pattern 90. The source drain pattern 86 includes a source pattern 82, a drain pattern 84, and a gap 88 separating the source pattern 82 from a drain pattern 84.

A width of the gap 88 is greater than about 10 µm. As described above, the gap 88 is formed through etching the source/drain pattern 86 to create the gap, then reflowing a multi-temperature phase-change material to close the gap so that the island pattern 90 is not etched. The gap 88 may be about 10 µm or wider as a result of the distance the liquid portion of the multi-temperature phase-change material flows during a reflow operation.

In one example, the island pattern 90 is disposed between a portion of the source/drain pattern 86 and extends a substantially uniform distance from the portion of the source/drain pattern 86. As described above, when reflowing the multi-temperature phase-change material, the liquid portion flows substantially uniformly as bounded by surface tension. Thus a resulting island pattern 90 etched using a reflowed multi-temperature phase-change material will also extend a substantially uniform distance from the portion of the source/drain pattern 86 etched by the initial multi-temperature phase-change material. The reflowed multi-temperature phase-change material may extend more than about 10 µm from an edge of the source/drain pattern 86. Thus, the island pattern 90 may extend more than about 10 µm from an edge of the source/drain pattern 86

In addition, the source pattern 82 and the drain pattern 84 may each be greater than about 40 µm wide. In particular, when deposited by printing a liquid multi-temperature phase-change material, the liquid drops deposited during the printing process may form solid drops greater than about 40 µm wide.

Although reflowing may have been described as being at a particular temperature, such a temperature may refer to a range of temperatures. For example, as described above an apparatus for reflowing may be capable of holding the temperature within a particular temperature range. As a result, even though set to the temperature, the apparatus may still vary the reflow temperature within the temperature range.

Although particular shapes and sizes have been used in the drawings to illustrate the relationships and transformations of layers, such dimensions are used for illustration purposes. In particular, dimensions of the multi-temperature phase-change materials as existing within an embodiment may take different shapes than those illustrated in the drawings.

Although particular embodiments have been described various modifications and combinations may be made and still be within the spirit and scope of the following claims.

The invention claimed is:

1. A method of forming a pattern, comprising:
   forming a first layer on a substrate;
   depositing a multi-temperature phase-change material over the first layer by digital printing;
   reflowing the multi-temperature phase-change material into a reflowed multi-temperature phase-change material, including heating the multi-temperature phase-change material up to a temperature where at least a portion of the multi-temperature phase-change material remains a solid; and
   patterning the first layer using the reflowed multi-temperature phase-change material as a mask.

2. The method of claim 1, further comprising:
   depositing a second layer over the first layer, wherein the multi-temperature phase-change material is deposited over the second layer; and
   patterning the second layer using the multi-temperature phase-change material as a mask.

3. The method of claim 1, reflowing the multi-temperature phase-change material further comprising heating the multi-temperature phase-change material such that a portion of the multi-temperature phase-change material extends substantially a predefined distance from a remainder of the multi-temperature phase-change material.

4. The method of claim 1, wherein:
   reflowing the multi-temperature phase-change material further comprises reflowing the multi-temperature phase-change material at a first reflow temperature; and
   further comprising, after patterning the first layer using the reflowed multi-temperature phase-change material as the mask:
   reflowing the multi-temperature phase-change material at a second reflow temperature, the second temperature being greater than the first temperature; and
   patterning the first layer using the multi-temperature phase-change material as a mask after reflowing at the second reflow temperature.

5. The method of claim 4, wherein the second reflow temperature is less than a temperature at which the multi-temperature phase-change material is in a substantially liquid state.

6. The method of claim 1, depositing the multi-temperature phase-change material further comprising printing the multi-temperature phase-change material when the multi-temperature phase-change material is in a substantially liquid state.

7. The method of claim 1, depositing the multi-temperature phase-change material on the second layer comprising:
   depositing an amount of the multi-temperature phase-change material insufficient to cover a desired pattern of the first layer; and
   further comprising reflowing the multi-temperature phase-change material such that the multi-temperature phase-change material covers the desired pattern of the first layer.

8. A method of forming a pattern, comprising:
   forming a first layer on a substrate;

depositing a multi-temperature phase-change material over the first layer by digital printing;

reflowing the multi-temperature phase-change material into a reflowed multi-temperature phase-change material, including; and patterning the first layer using the reflowed multi-temperature phase-change material as a mask;

wherein:

at least a first portion of the multi-temperature phase-change material undergoes a phase change at a first temperature; and at least a second portion of the multi-temperature phase-change material undergoes a phase change at a second temperature, the second temperature being greater than the first temperature.

9. The method of claim 8, reflowing the multi-temperature phase-change material comprising heating the multi-temperature phase-change material such that only the first portion of the multi-temperature phase-change material undergoes a phase change.

10. The method of claim 8, the multi-temperature phase-change material being a mixture of a first material characterized by a first phase change at the first temperature and a second material characterized by a phase change at the second temperature.

11. The method of claim 8, wherein:

performing the reflowing of the multi-temperature phase-change material comprises performing the reflowing of the multi-temperature phase-change material with an apparatus configured to maintain an operating temperature within a temperature range when the operating temperature is set to a temperature setpoint; and a difference between the first temperature and the second temperature being greater than a magnitude of the temperature range.

12. The method of claim 8, reflowing the multi-temperature phase-change material comprising heating the multi-temperature phase-change material such that a portion of the multi-temperature phase-change material extends substantially a predefined distance from a remainder of the multi-temperature phase-change material.

13. The method of claim 8, wherein:

reflowing the multi-temperature phase-change material comprises reflowing the multi-temperature phase-change material at a first reflow temperature; and further comprising, after patterning the first layer using the reflowed multi-temperature phase-change material as the mask:

reflowing the multi-temperature phase-change material at a second reflow temperature, the second temperature being greater than the first temperature; and patterning the first layer using the multi-temperature phase-change material as a mask after reflowing at the second reflow temperature.

14. The method of claim 13, wherein the second reflow temperature is less than a temperature at which the multi-temperature phase-change material is in a substantially liquid state.

15. The method of claim 8, depositing the multi-temperature phase-change material further comprising printing the multi-temperature phase-change material when the multi-temperature phase-change material is in a substantially liquid state.

16. The method of claim 8, depositing the multi-temperature phase-change material on the second layer comprising:

depositing an amount of the multi-temperature phase-change material insufficient to cover a desired pattern of the second layer; and further comprising reflowing the multi-temperature phase-change material such that the multi-temperature phase-change material covers the desired pattern of the second layer.

* * * * *